US012739964B2

(12) United States Patent
Wang et al.

(10) Patent No.: US 12,739,964 B2
(45) Date of Patent: Sep. 15, 2026

(54) HEAT DISSIPATING ASSEMBLY FOR CIRCUIT

(71) Applicant: Schneider Electric (China) Co., Ltd., Beijing (CN)

(72) Inventors: Zhibao Wang, Beijing (CN); Baoyun Bi, Beijing (CN); Xiaoqiang Li, Beijing (CN)

(73) Assignee: Schneider Electric (China) Co., Ltd., Beijing (CN)

( * ) Notice: Subject to any disclaimer, the term of this patent is extended or adjusted under 35 U.S.C. 154(b) by 183 days.

(21) Appl. No.: 18/391,533

(22) Filed: Dec. 20, 2023

(65) Prior Publication Data

US 2025/0168964 A1 May 22, 2025

(30) Foreign Application Priority Data

Nov. 17, 2023 (CN) ......................... 202323120820.8

(51) Int. Cl.
*H05K 1/02* (2006.01)
*H05K 7/20* (2006.01)

(52) U.S. Cl.
CPC ........... *H05K 1/0204* (2013.01); *H05K 7/205* (2013.01); *H05K 7/20509* (2013.01); *H05K 2201/062* (2013.01); *H05K 2201/066* (2013.01)

(58) Field of Classification Search
CPC .... H05K 1/0204; H05K 1/021; H05K 1/0203; H05K 1/0201; H05K 7/205; H05K 7/20509; H05K 2201/062; H05K 2201/066
See application file for complete search history.

(56) References Cited

U.S. PATENT DOCUMENTS 8,787,022 B2 * 7/2014 Moriai .................... G06F 1/185 174/547
2018/0019186 A1 * 1/2018 Kikugawa ........... H01L 23/4006
(Continued)

FOREIGN PATENT DOCUMENTS

CN 108811450 A 11/2018
JP 2004095697 A 3/2004
(Continued)

OTHER PUBLICATIONS

KR-20200110040-A Translation (Year: 2020).*
(Continued)

*Primary Examiner* — Jayprakash N Gandhi
*Assistant Examiner* — Matthew Sinclair Muir
(74) *Attorney, Agent, or Firm* — FIG. 1 Patents

(57) ABSTRACT

Embodiments of the present disclosure provides a heat dissipating assembly for a circuit, the circuit comprises a printed circuit board and a plurality of electronic components, the printed circuit board is provided with a plurality of first through holes for pins of the plurality of electronic components to pass through, the heat dissipating assembly comprises: a bracket connected to the printed circuit board, the bracket is provided with a second through hole for a respective pin to pass through at a position corresponding to each first through hole; a plurality of heat dissipating sheets each disposed against a pair of electronic components of the plurality of electronic components; and a plurality of limiting members each disposed adjacent to a side of the bracket away from the printed circuit board, to limit each pair of electronic components and a respective heat dissipating sheet to a predetermined position relative to the bracket.

6 Claims, 4 Drawing Sheets

(56) References Cited

U.S. PATENT DOCUMENTS

2018/0352655 A1* 12/2018 Kuo ....................... H05K 3/301
2024/0244750 A1* 7/2024 Hayashiguchi ......... H01L 25/07
2024/0244804 A1* 7/2024 Horiba ............... H05K 7/20409

FOREIGN PATENT DOCUMENTS

JP 2006310552 A 11/2006
KR 20200110040 A * 9/2020 ............... H02K 5/18

OTHER PUBLICATIONS

Extended European Search Report dated Jun. 17, 2024 for corresponding European Patent Application No. 23218810.2-1201, 30 pages.

* cited by examiner

HEAT DISSIPATING ASSEMBLY FOR CIRCUIT

CROSS-REFERENCE

The present application claims priority to Chinese Patent Application No. 2023231208208, filed on Nov. 17, 2023, and entitled "HEAT DISSIPATING ASSEMBLY FOR CIRCUIT", the entirety of which is incorporated herein by reference.

FIELD

Embodiments of the present disclosure relates to the field of electrical equipment, and more particularly to a heat dissipating assembly for a circuit.

BACKGROUND

A printed circuit board (PCB) usually needs to be used in conjunction with multiple electronic components. However, it is very inconvenient to align pins of the electronic components with the printed circuit board (PCB) during a mounting process. In addition, each electronic component needs to have a separate heat dissipating sheet for heat dissipation, which can lead to problems such as low heat dissipation efficiency. Therefore, the design needs to be optimized.

SUMMARY

An object of the present disclosure is to provide a heat dissipating assembly for a circuit to at least partially solve the above problems.

In a first aspect of the present disclosure, there is provided a heat dissipating assembly for a circuit, the circuit comprises a printed circuit board and a plurality of electronic components, the printed circuit board is provided with a plurality of electronic components for a pin through a plurality of first through holes, characterized in that the heat dissipating assembly comprises: a bracket connected to the printed circuit board, the bracket is provided with a second through hole for a respective pin to pass through at a position corresponding to each first through hole; a plurality of heat dissipating sheets, each disposed against a pair of electronic components of the plurality of electronic components; and a plurality of limiting members, each disposed adjacent to a side of the bracket away from the printed circuit board, to limit each pair of electronic components and a respective heat dissipating sheet to a predetermined position relative to the bracket.

According to embodiments of the present disclosure, by providing the second through hole for the pin to pass through at a position corresponding to each of the first through holes on the printed circuit board of the bracket, and providing the plurality of heat dissipating sheets disposed against the plurality of electronic components separately, and providing the plurality of limiting members to limit each pair of electronic components and the respective heat dissipating sheet to the predetermined position relative to the bracket, the pins of the plurality of electronic components can be more easily aligned with and mounted to the printed circuit board, thereby improving assembly efficiency.

In some embodiments, the bracket comprises a plurality of mounting slots, each disposed on a side of the bracket away from the printed circuit board adjacent to the second through hole.

In some embodiments, the plurality of limiting members comprise a plurality of clips, each coupled to a respective mounting slot, an end of each clip away from the mounting slot is formed with a buckle part to limit a pair of electronic components and a respective heat dissipating sheet to a predetermined position relative to the bracket.

In some embodiments, a side of the bracket facing the printed circuit board is provided with a plurality of first mounting holes, each of the first mounting holes extend in a direction away from the printed circuit board.

In some embodiments, the plurality of limiting members comprise a plurality of fastening members, each adapted to be screwed into one of the plurality of first mounting holes.

In some embodiments, each of the plurality of electronic components is provided with a through hole at a position corresponding to one of the plurality of first mounting holes, and the through hole is provided for a respective fastening member to pass through.

In some embodiments, each of the plurality of heat dissipating sheets is provided with a second mounting hole at a position corresponding to the through hole, and the second mounting hole provided for a respective fastening member to be screwed into.

In some embodiments, the heat dissipating assembly further comprises an insulating sheet and a heat dissipating plate, the insulating sheet is disposed against the plurality of heat dissipating sheets, and the heat dissipating plate is disposed against the insulating sheet away from the plurality of heat dissipating sheets.

In some embodiments, the heat dissipating plate comprises a plurality of insulating parts, each disposed adjacent to one of the plurality of heat dissipating sheets and forming a positioning part for a positioning member to be screwed into.

In some embodiments, each of the plurality of the heat dissipating sheet is provided with a third mounting hole at a position corresponding to a positioning part, and the third mounting hole is provided for a respective positioning member to be screwed into.

It should be understood that the contents described in this content section are not intended to limit the key features or important features of the embodiments of the present disclosure, nor are they intended to limit the scope of the present disclosure. Other features of the present disclosure will become readily understood from the following description.

BRIEF DESCRIPTION OF THE DRAWINGS

The above and other features, advantages and aspects of the various embodiments of the present disclosure will become more apparent in conjunction with the accompanying drawings and with reference to the following detailed description. In the drawings, like or similar reference numerals denote like or similar elements, wherein.

DESCRIPTION OF THE REFERENCE NUMERALS

Figure 1:
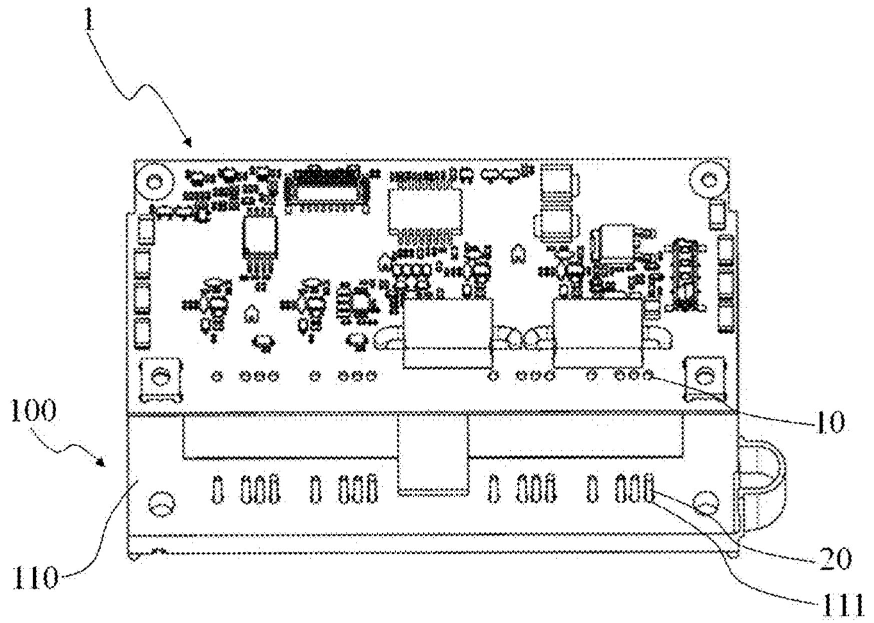
FIG. 1 shows a schematic structural diagram of the printed circuit board and the heat dissipating assembly according to an embodiment of the present disclosure.

1 printed circuit board;
10 first through hole;
20 pin;
2 electronic component;
3 positioning member;
21 through hole;
100 heat dissipating assembly;
110 bracket;
111 second through hole;
112 mounting slot;
113 first mounting hole;
120 heat dissipating sheet;
121 second mounting hole;
122 third mounting hole;
132 fastening member;
140 insulating sheet;
150 heat dissipating plate;
151 insulating parts;
1510 positioning part;
114 partition part;

DETAILED DESCRIPTION

The preferred embodiments of the present disclosure will be described in more detail below with reference to the accompanying drawings. Although the preferred embodiments of the present disclosure are shown in the drawings, it should be understood that the present disclosure can be implemented in various forms and should not be limited by the embodiments set forth herein. Instead, these embodiments are provided to make the present disclosure more thorough and complete, and to fully convey the scope of the present disclosure to those skilled in the art.

The term "including" and its variations used in this article indicate open inclusion, that is, "including but not limited to". Unless otherwise stated, the term "or" means "and/or". The term "based on" means "at least partially based on". The terms "an example embodiment" and "an embodiment" mean "at least one example embodiment". The term "another embodiment" means "at least one additional embodiment". The terms "first", "second", etc. can refer to different or identical objects.

As described above, it is very inconvenient to align and mount the pins of electronic components when they are matched with the printed circuit board (PCB). In addition, each electronic component needs to set up a separate heat dissipating sheet for heat dissipation, which will lead to problems such as low heat dissipation efficiency. Therefore, the design needs to be optimized. Embodiments of the present disclosure provide a heat dissipating assembly, in this scheme, by setting up a second through hole provided for a pin to pass through at a position corresponding to each first through hole on the printed circuit board of the bracket, and setting up the plurality of heat dissipating sheets disposed against the plurality of electronic components separately, and setting up the plurality of limiting members to limit each pair of electronic components and a respective heat dissipating sheet to a predetermined position relative to the bracket, making it easier to align and mount the pins of the plurality of electronic components on the printed circuit board, thereby improving assembly efficiency. By sequentially setting up the insulating sheet and the heat dissipating plate on the plurality of heat dissipating sheet, it is possible to further improve heat dissipation efficiency while ensuring insulation between the plurality of electronic components and the heat dissipating plate. Hereinafter, the principles of the present disclosure will be described in conjunction with FIGS. 1 to 7.

Figure 2:
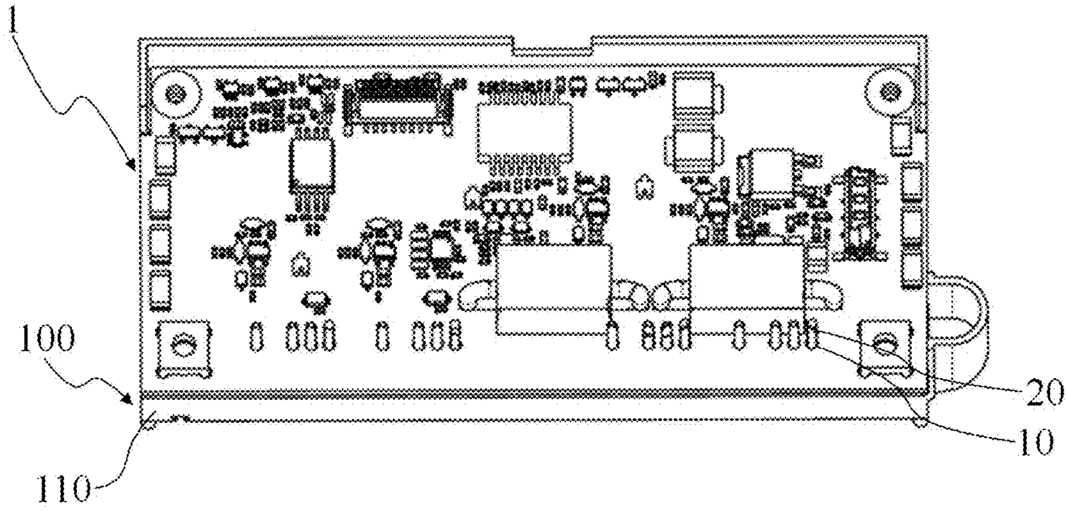
FIG. 2 shows a schematic assembly diagram of the printed circuit board and the heat dissipating assembly shown in FIG. 1.
Figure 3:
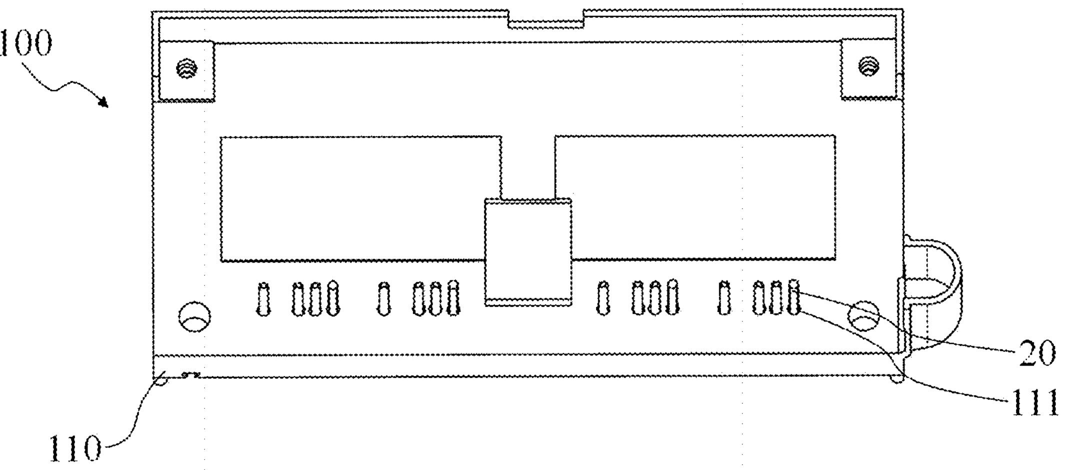
FIG. 3 shows a schematic structural diagram of the heat dissipating assembly according to an embodiment of the present disclosure.
Figure 4:
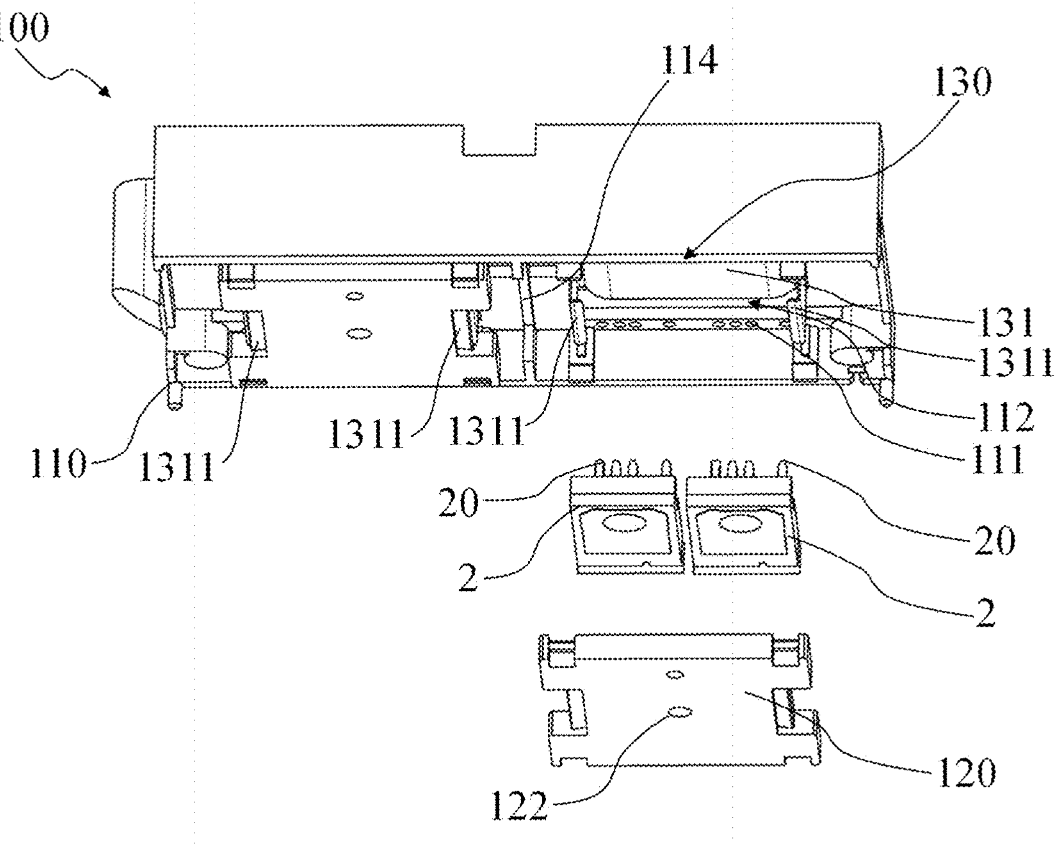
FIG. 4 shows a schematic partial explosion diagram of the heat dissipating assembly shown in FIG. 3.

FIG. 1 shows a schematic structural diagram of the printed circuit board and the heat dissipating assembly according to an embodiment of the present disclosure. FIG. 2 shows a schematic assembly diagram of the printed circuit board and the heat dissipating assembly shown in FIG. 1. FIG. 3 shows a schematic structural diagram of the heat dissipating assembly according to an embodiment of the present disclosure. FIG. 4 shows a schematic partial explosion diagram of the heat dissipating assembly shown in FIG. 3. As shown in FIGS. 1 to 4, the printed circuit board 1 described herein is provided with a plurality of first through holes 10 provided for pins 20 of a plurality of electronic components 2 to pass through. The heat dissipating assembly 100 described herein generally includes a bracket 110, a plurality of heat dissipating sheets 120, and a plurality of limiting members 130. The bracket 110 is connected to the printed circuit board 1 and provided with a second through hole 111 provided for the pins 20 to passed through at a position corresponding to each first through hole 10. Each heat dissipating sheet 120 of the plurality of heat dissipating sheets 120 is disposed against a pair of electronic components 2 of the plurality of electronic components 2. Each limiting member 130 of the plurality of limiting members 130 is disposed adjacent to a side of the bracket 110 away from the printed circuit board 1, so as to limit each pair of electronic components 2 and a respective heat dissipating sheets 120 to a predetermined position relative to the bracket 110.

In an embodiment, as shown in FIGS. 1 to 3, a plurality of pins 20 extend from a side of the bracket 110 away from the printed circuit board 1 through the second through hole 111 and extend in a direction adjacent to the printed circuit board 1. In the case that the printed circuit board 1 is mounted to the bracket 110, each pin 20 passes through a predetermined first through hole 10 on the printed circuit board 1, and then each pin 20 can be mounted to the printed circuit board 1 by soldering, etc. The number and size of the predetermined first through holes 10 and second through holes 20 are determined by the number and size of the pins 20 in the actual working scenario. Through the above structural design, the pins of a plurality of electronic components can be quickly aligned and mounted to the printed circuit board, greatly improving the assembly efficiency.

In an embodiment, as shown in FIG. 4, the bracket 110 includes a plurality of mounting slots 112. Each mounting slot 112 is disposed adjacent to the second through hole 111 on a side of the bracket 110 away from the printed circuit board 1. The internal space formed by each mounting slot 112 is provided the limiting member 130, the plurality of electronic components 2, and the heat dissipating sheet 120 to mount. A partition part 114 is provided between each mounting slot 112 to prevent the plurality of electronic components 2 and the heat dissipating sheet 120 mounted in each mounting slot 112 from interfering with each other, so that the plurality of electronic components 2 mounted in each mounting slot 112 can independently dissipate heat, greatly improving the heat dissipation performance.

In an embodiment, as shown in FIG. 4, the plurality of limiting members 130 include a plurality of clips 131. Each clip 131 is coupled to a respective mounting slot 112. The end of each clip 131 away from the mounting slot 112 is formed with a buckle part 1311 to limit a pair of electronic components 2 and a respective heat dissipating sheet 120 to a predetermined position relative to the bracket 110. In the case that the clip 131 is coupled to a respective mounting slot 112, the mounting slot 112 can prevent the clip 131 and a pair of electronic components 2 and a respective heat dissipating sheet 120 held by the clip 131 from sliding relative to each other. In the case that a pair of electronic components 2 and a respective heat dissipating sheet 120 are sequentially mounted to a clip 131, the buckle part 1311 can fasten the heat dissipating sheet 120 on a side of the heat dissipating sheet 120, so that the heat dissipating sheet 120 is reliably disposed against the respective pair of electronic components 2, improving the stability of the connection. It should be understood that based on the teachings given in this disclosure, those of ordinary skill in the art can think of other types of clip to achieve the above functions, and these implementations fall within the scope of this disclosure.

Figure 5:
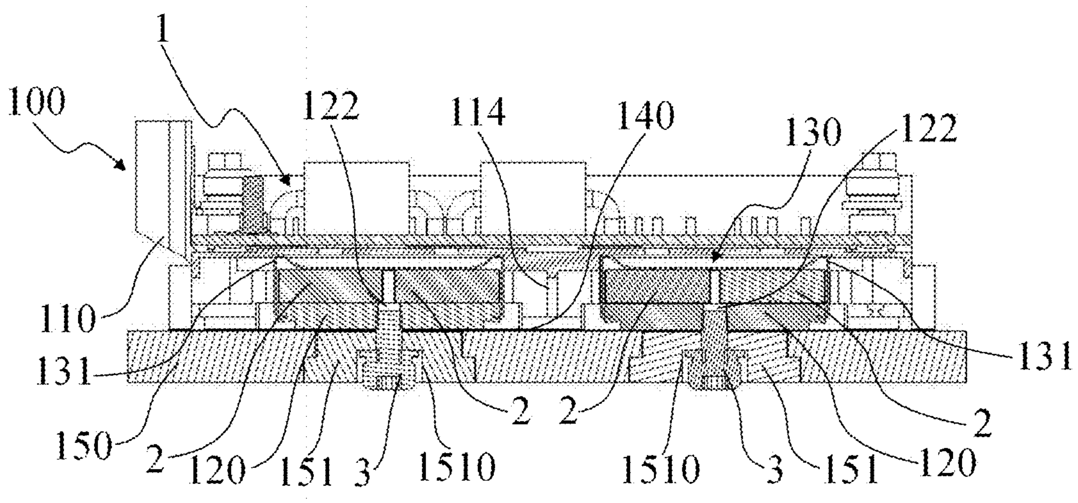
FIG. 5 shows a schematic cross-sectional diagram of the printed circuit board and the heat dissipating assembly according to an embodiment of the present disclosure.

FIG. 5 shows a schematic cross-sectional diagram of the printed circuit board and the heat dissipating assembly according to an embodiment of the present disclosure. In an embodiment, as shown in FIG. 5, the heat dissipating assembly 100 further includes an insulating sheet 140 and a heat dissipating plate 150. The insulating sheet 140 is provided against a plurality of heat dissipating sheets 120. The heat dissipating plate 150 is provided against a side of the insulating sheet 140 away from the plurality of heat dissipating sheets 120. The insulating sheet 140 can maintain electrical insulation between the plurality of heat dissipating sheets 120 and the heat dissipating plate 150 during the heat dissipation process, thereby ensuring that there is no interference between the plurality of electronic components 2. The heat dissipating plate 150 can increase the heat dissipation area and further improve the heat dissipation efficiency.

In an embodiment, as shown in FIGS. 4 and 5, the heat dissipating plate 150 includes a plurality of insulating parts 151. Each insulating part 151 is disposed adjacent to one of the plurality of heat dissipating sheets 120 and is formed with a positioning part 1510 provided for the positioning member 3 to be screwed into. A third mounting hole 122 is provided at a position corresponding to one of the positioning parts 1510 of each of the plurality of heat dissipating sheets 120, and the third mounting hole 122 is provided for a respective positioning member 3 to be screwed into. The positioning member 3 can reliably fix the heat dissipating plate 150 and the heat dissipating sheet 120 by screwing into the positioning part 1510 and the third mounting hole 122. In an embodiment, the positioning member 3 uses a bolt. In other embodiments, any type of conventional fastening element, such as a bolt, can be used, and these implementations fall within the scope of the present disclosure.

Continuing with reference to FIG. 5, based on the positioning member 3 is typically a metal material, having a certain conductivity. Therefore, the insulating part 151 is provided to reliably electrically isolate the positioning member 3 from the heat dissipating plate 150. In an embodiment, the insulating part 151 may be integrally formed with the heat dissipating plate 150 as a member. In other embodiments, the insulating part 151 may be coupled to the heat dissipating plate 150 as a separate member. These implementations fall within the scope of the present disclosure.

Figure 6:
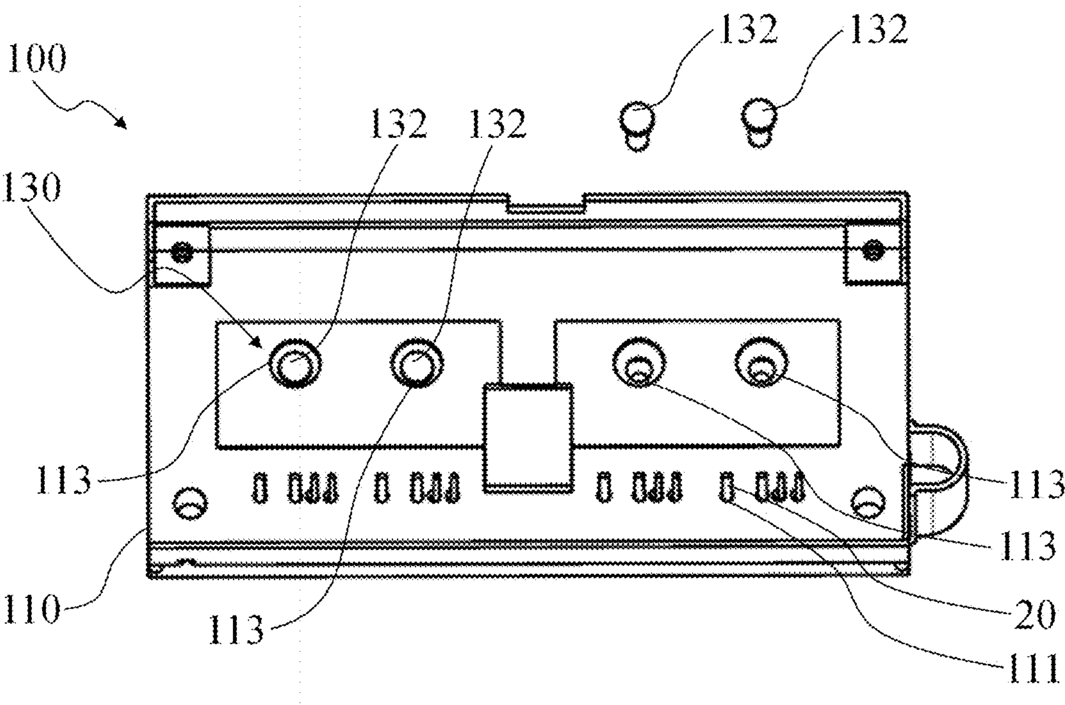
FIG. 6 shows a schematic structural diagram of the heat dissipating assembly according to another embodiment of the present disclosure.
Figure 7:
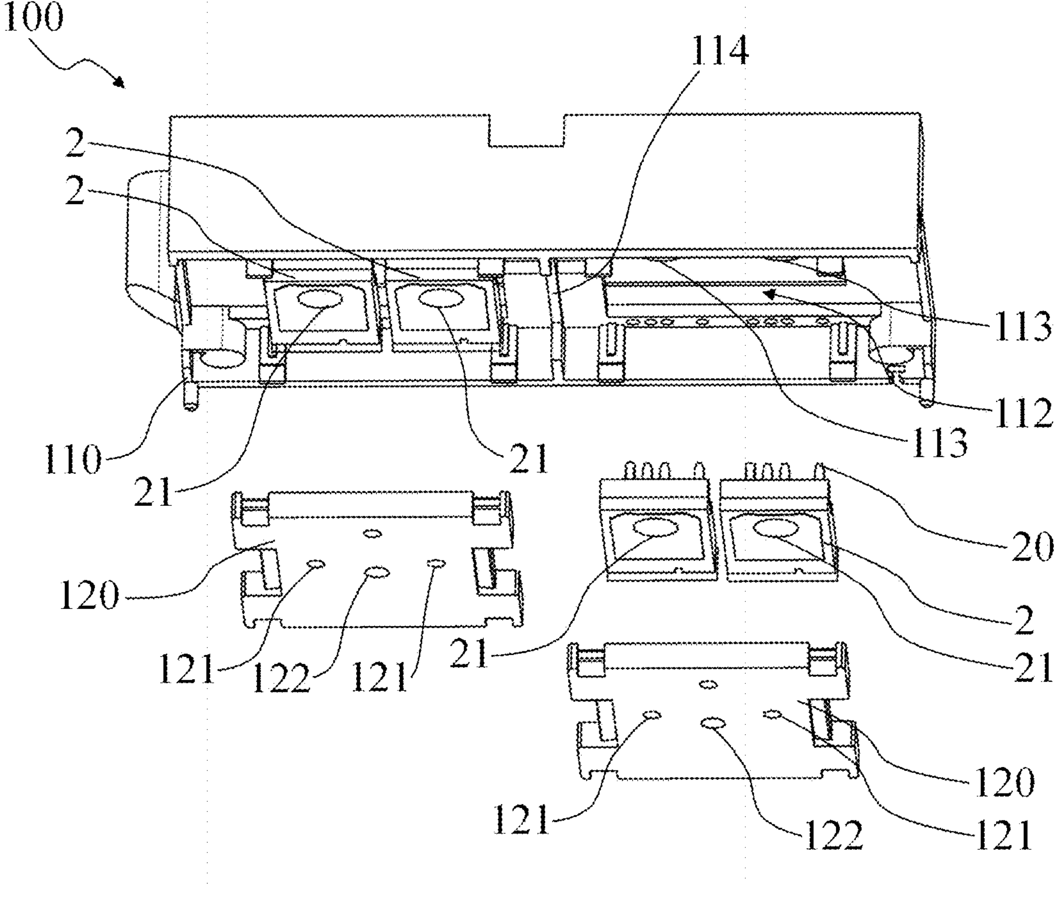
FIG. 7 shows a schematic partial explosion diagram of the heat dissipating assembly shown in FIG. 6.

FIG. 6 shows a schematic structural diagram of the heat dissipating assembly according to another embodiment of the present disclosure. FIG. 7 shows a schematic partial explosion diagram of the heat dissipating assembly shown in FIG. 6. The structure of the heat dissipating assembly shown in FIGS. 6 and 7 is similar to that described in conjunction with FIGS. 1 to 5, except that the bracket, limiting member, and heat dissipating sheet adopt different structural forms. Only the differences between the two will be described below, and the same parts will not be repeated.

In an embodiment, as shown in FIGS. 2 and 6, a side of the bracket 110 facing the printed circuit board 1 is provided with a plurality of first mounting holes 113. Each first mounting hole 113 extends in a direction away from the printed circuit board 1. The plurality of limiting members 130 includes a plurality of fastening members 132. Each fastening member 132 is adapted to be screwed into one of the plurality of first mounting holes 113.

In an embodiment, as shown in FIGS. 6 and 7, each of the plurality of electronic components 2 is provided with a through hole 21 at a position corresponding to a first mounting hole 113. The through hole 21 is provided for a respective fastening member 132 to pass through. Each of the plurality of heat dissipating sheets 120 is provided with a second mounting hole 121 at a position corresponding to the through hole 21. The second mounting hole 121 is provided for a respective fastening member 132 to pass through. In the case that a pair of electronic components 2 and a respective heat dissipating sheet 120 are sequentially mounted to a mounting slot 112, the fastening member 132 can reliably make the heat sink 120 disposed against a respective pair of electronic components 2 by screwing into the first mounting hole 113 and the second mounting hole 121, thereby improving the stability of the connection.

According to embodiments of the present disclosure, the heat dissipating assembly 100 is not only easy to mount in the actual operating scenario, but also has good heat dissipation and insulation properties.

The above has described various embodiments of the present disclosure. The above description is exemplary, not exhaustive, and is not limited to the disclosed embodiments. Without departing from the scope and spirit of the described embodiments, many modifications and changes will be apparent to those of ordinary skill in the field. The choice of terms used in this article is intended to best explain the principles, practical applications, or technical improvements in the market of each embodiment, or to enable other ordinary technicians in the field to understand the various embodiments disclosed herein.

We claim:

1. A heat dissipating assembly for a circuit, the circuit comprises a printed circuit board and a plurality of electronic components, the printed circuit board is provided with a plurality of first through holes for pins of the plurality of electronic components to pass through, wherein the heat dissipating assembly comprises:

a bracket connected to the printed circuit board, the bracket is provided with a second through hole for a respective pin to pass through at a position corresponding to each first through hole, wherein a side of the bracket facing the printed circuit board is provided with a plurality of first mounting holes, each of the first mounting holes extends in a direction away from the printed circuit board;

a plurality of heat dissipating sheets each disposed against a pair of electronic components of the plurality of electronic components; and a plurality of fastening members each disposed adjacent to a side of the bracket away from the printed circuit board and each adapted to be screwed into one of the plurality of first mounting holes, to limit each pair of electronic components and a respective heat dissipating sheet to a predetermined position relative to the bracket, wherein each of the plurality of electronic components is provided with a through hole at a position corresponding to one of the plurality of first mounting holes, and the through hole is provided for a respective fastening member to pass through, and wherein each of the plurality of heat dissipating sheets is provided with a second mounting hole at a position corresponding to the through hole, and the second mounting hole is provided for a respective fastening member to be screwed into.

2. The heat dissipating assembly of claim 1, wherein the bracket comprises a plurality of mounting slots each disposed on a side of the bracket away from the printed circuit board adjacent to the second through hole.

3. The heat dissipating assembly of claim 2, wherein a partition part is situated between two mounting slots of the plurality of mounting slots to prevent the plurality of electronic components interfering with each other.

4. A heat dissipating assembly for a circuit, the circuit comprises a printed circuit board and a plurality of electronic components, the printed circuit board is provided with a plurality of first through holes for pins of the plurality of electronic components to pass through, wherein the heat dissipating assembly comprises:

a bracket connected to the printed circuit board, the bracket is provided with a second through hole for a respective pin to pass through at a position corresponding to each first through hole, the bracket including a plurality of mounting slots each disposed on a side of the bracket away from the printed circuit board adjacent to the second through hole;

a plurality of heat dissipating sheets each disposed against a pair of electronic components of the plurality of electronic components; and a plurality of clips each disposed adjacent to a side of the bracket away from the printed circuit board, to limit each pair of electronic components and a respective heat dissipating sheet to a predetermined position relative to the bracket, wherein the plurality of clips are each coupled to a respective mounting slot, an end of each clip away from the mounting slot is formed with a buckle part to limit a pair of electronic components and a respective heat dissipating sheet to a predetermined position relative to the bracket.

5. A heat dissipating assembly for a circuit, the circuit comprises a printed circuit board and a plurality of electronic components, the printed circuit board is provided with a plurality of first through holes for pins of the plurality of electronic components to pass through, wherein the heat dissipating assembly comprises:

a bracket connected to the printed circuit board, the bracket is provided with a second through hole for a respective pin to pass through at a position corresponding to each first through hole;

a plurality of heat dissipating sheets each disposed against a pair of electronic components of the plurality of electronic components;

a plurality of limiting members each disposed adjacent to a side of the bracket away from the printed circuit board, to limit each pair of electronic components and a respective heat dissipating sheet to a predetermined position relative to the bracket; and an insulating sheet and a heat dissipating plate, the insulating sheet is disposed against the plurality of heat dissipating sheets, and the heat dissipating plate is disposed against a side of the insulating sheet away from the plurality of heat dissipating sheets, wherein the heat dissipating plate comprises a plurality of insulating parts each disposed adjacent to one of the plurality of heat dissipating sheets and forming a positioning part for a positioning member to be screwed into.

6. The heat dissipating assembly of claim 5, wherein each of the plurality of heat dissipating sheets is provided with a third mounting hole at a position corresponding to a positioning part, and the third mounting hole is provided for a respective positioning member to be screwed into.

* * * * *